US006208773B1

(12) United States Patent
Wickham et al.

(10) Patent No.: US 6,208,773 B1
(45) Date of Patent: Mar. 27, 2001

(54) ADDRESSABLE, SEMICONDUCTOR ADAPTABLE BRAGG GRATINGS (ASABG)

(75) Inventors: Michael G. Wickham, Rancho Palos Verdes; Eric L. Upton, Redondo Beach, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/252,497

(22) Filed: Feb. 18, 1999

(51) Int. Cl.[7] .......... G02F 1/335
(52) U.S. Cl. .......... 385/10; 385/8; 385/37
(58) Field of Search .......... 385/10, 8, 37, 385/129–132

(56) References Cited

U.S. PATENT DOCUMENTS

| | | | |
|---|---|---|---|
| 5,416,866 * | 5/1995 | Sahlén | 385/37 |
| 5,572,616 * | 11/1996 | Aoki et al. | 385/131 |
| 6,008,675 * | 12/1999 | Handa | 327/96 |

OTHER PUBLICATIONS

Jean–Pierre Weber, "Optimization of the Carrier–Induced Effective Index Change in InGaAsP Waveguides—Application to Tunable Bragg Filters", p. 1801–1816, IEEE Journal of Quantum Electronics, vol. 30, No. 8, Aug. 1994.

* cited by examiner

*Primary Examiner*—John D. Lee
*Assistant Examiner*—Jennifer Doan
(74) *Attorney, Agent, or Firm*—Michael S. Yatsko

(57) ABSTRACT

A Bragg grating device (10) is provided including a semiconductive optical waveguide (12) with a Bragg grating structure (14) formed along its length. A first plurality of electrodes (16) are disposed on a first surface (18) of the optical waveguide (12) and individually communicate with select members of the Bragg grating structure (14). A second plurality of electrodes (20) are disposed on a second surface (22) of the optical waveguide (12) and individually communicate with select members of the Bragg grating structure (14) such that individual electrodes of the second plurality of electrodes (20) are electrically coupled to individual electrodes of the first plurality of electrodes (16) via the Bragg grating structure (14). As such, a plurality of addressable portions (30) of the Bragg grating device (6) are defined. A plurality of electrical leads (32) are electrically coupled between individual electrodes of the second plurality of electrodes (20) and a power source (38) such that a refractive index of each portion (30) along the Bragg grating structure (14) may be selectively varied along the length of the optical waveguide (12). As a further feature of the present invention, a controller (36) is disposed between the plurality of electrical leads (32) and the power source (38) for varying a magnitude and distribution of current among the individual portions (30) of the Bragg grating structure (14) to effectuate different optical applications.

12 Claims, 3 Drawing Sheets

30
10
18
16
24
14
12
22
32
26
34
28
20
36
CONTROLLER
38
POWER SOURCE

ADDRESSABLE, SEMICONDUCTOR ADAPTABLE BRAGG GRATINGS (ASABG)

BACKGROUND OF THE INVENTION

1. Technical Field

The present invention relates generally to Bragg gratings and, more particularly, to an addressable, adaptable, semiconductive Bragg grating device.

2. Discussion

Fiber optic Bragg gratings lack a mechanism for enabling rapid modification of their characteristics such as center wavelength and spectral shape. Semiconductive Bragg gratings offer more control over center wavelength and spectral shape. A typical single mode semiconductor waveguide has a core thickness of several thousand angstroms, and an electrode placed on the top and bottom of the waveguide using a conducting substrate. A contact layer is placed on top with an interconnect metal. To vary the refractive index of the semiconductor, current is injected across the electrodes.

Although single mode semiconductive waveguides provide an advantage over fiber optic waveguides, they lack variability. As such, it is desirable to provide a semiconductive Bragg grating having a plurality of individual addressable portions along its length such that an adaption rate of several hundred MHz can be achieved.

SUMMARY OF THE INVENTION

The above and other objects are provided by a Bragg grating device including a semiconductive optical waveguide. The semiconductive optical waveguide has a Bragg grating structure formed along its length. A first plurality of electrodes are disposed on a first surface of the optical waveguide and individually communicate with select members of the Bragg grating structure. A second plurality of electrodes are disposed on a second surface of the optical waveguide and individually communicate with select members of the Bragg grating structure such that individual electrodes of the second plurality of electrodes are electrically coupled to individual electrodes of the first plurality of electrodes via the Bragg grating structure. As such, a plurality of addressable portions of the Bragg grating device are defined. A plurality of electrical leads are electrically coupled between individual electrodes of the second plurality of electrodes and a power source such that a refractive index of each portion along the Bragg grating structure may be selectively varied along the length of the optical waveguide. As a further feature of the present invention, a controller is disposed between the plurality of electrical leads and the power source for varying a magnitude and distribution of current among the individual portions of the Bragg grating structure to effectuate different optical applications.

BRIEF DESCRIPTION OF THE DRAWINGS

In order to appreciate the manner in which the advantages and objects of the invention are obtained, a more particular description of the invention will be rendered by reference to specific embodiments thereof which are illustrated in the appended drawings. Understanding that these drawings only depict preferred embodiments of the present invention and are not therefore to be considered limiting in scope, the invention will be described and explained with additional specificity and detail through the use of the accompanying drawings in which.

DETAILED DESCRIPTION OF THE PREFERRED EMBODIMENTS

The present invention is directed towards an addressable, adaptable, semiconductive Bragg grating. According to the present invention, the refractive index of individual portions of the semiconductive Bragg grating can be controlled independent from other portions of the grating. As such, the profile of the Bragg grating structure may be selectively modified to effect a variety of function changes of the Bragg grating.

Figure 1:
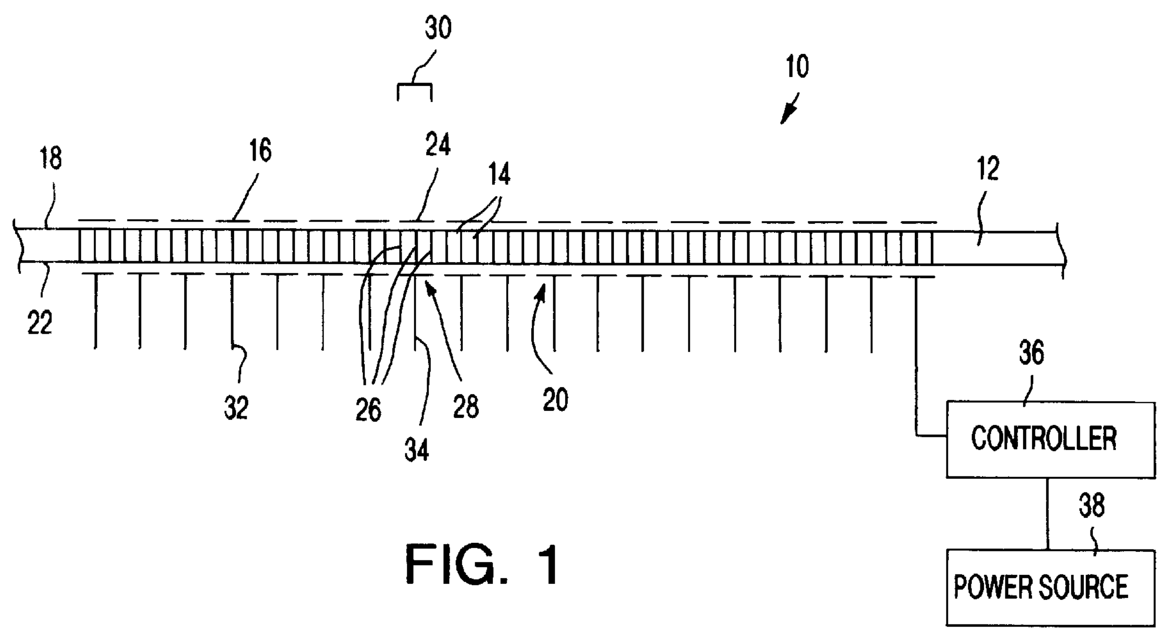
FIG. 1 is a schematic view illustrating the addressable adaptive semiconductive Bragg grating device of the present invention.

Turning now to the drawing figures, FIG. 1 illustrates the addressable, adaptable, semiconductive Bragg grating device of the present invention. The Bragg grating device 10 includes an optical waveguide 12 having a Bragg grating structure 14 formed therein along its length. A first plurality of electrodes 16 are disposed along a first surface 18 of the waveguide 12. A second plurality of electrodes 20 are disposed along a second surface 22 of the waveguide 12. The length of the device 10, L, is preferably several hundred microns. The precise length depends on the desired value of $\kappa L$ and coupling strength of the grating 14, $\kappa$, which is determined by the etched depth of the grating 14 and its proximity to the peak of the propagating mode.

The first plurality of electrodes 16 includes a number of individual electrodes, such as electrode 24, electrically isolated from the remainder of individual electrodes in the first plurality of electrodes 16. However, each of the individual electrodes of the first plurality of electrodes 16, such as electrode 24, communicates with select members of the Bragg grating structure 14, such as members 26. Similarly, each of the individual electrodes of the second plurality of electrodes 20, such as electrode 28, is electrically isolated from the remainder of individual electrodes in the second plurality of electrodes 28. However, each of the individual electrodes of the plurality of electrodes 20, such as electrode 28, communicates with select individual members of the Bragg grating structure 14, such as members 26. According to the above structure, individual electrodes of the first plurality of electrodes 16 are electrically coupled to individual electrodes of the second plurality of electrodes 20 through select members of the Bragg grating structure 14. As such, a plurality of individual addressable portions of the Bragg grating device 10, such as portion 30, are defined. Preferably, the individual members of the first and second plurality of electrodes 16 and 20 are electrically isolated from one another by axially spacing them apart along the length of the waveguide 12.

A plurality of electrical leads 32 are discretely electrically coupled to the second plurality of electrodes 20. That is, individual electrical leads, such as lead 34, are connected to individual electrodes of the second plurality of electrodes 20, such as electrode 28. As such, each of the individual addressable portions 30 of the Bragg grating device 10 are separately powered. The plurality of electrical leads 32 are electrically connected at an opposite end to a controller 36. For the sake of clarity, only one of the electrical leads 32 in FIG. 1 is illustrated as being connected to the controller 36 although one skilled in the art will appreciate that all of the plurality of electrical leads 32 are separately connected thereto.

The controller 36 is coupled to a power source 38 for supplying an electrical current to the plurality of electrical leads 32. The controller 36 is operable for controlling the magnitude and distribution of current from the power source 38 among the electrical leads 32. That is, the current from the power source 38 may be selectively delivered to none of the electrical leads 32, all of the electrical leads 32, an individual electrical lead 32 or select combinations of electrical leads 32. Moreover, the level of current delivered to any one electrical lead 32 may be varied. As such, the index of refraction of each portion 30 of the Bragg grating structure 14 in the device 10 may be selectively controlled.

Figure 2:
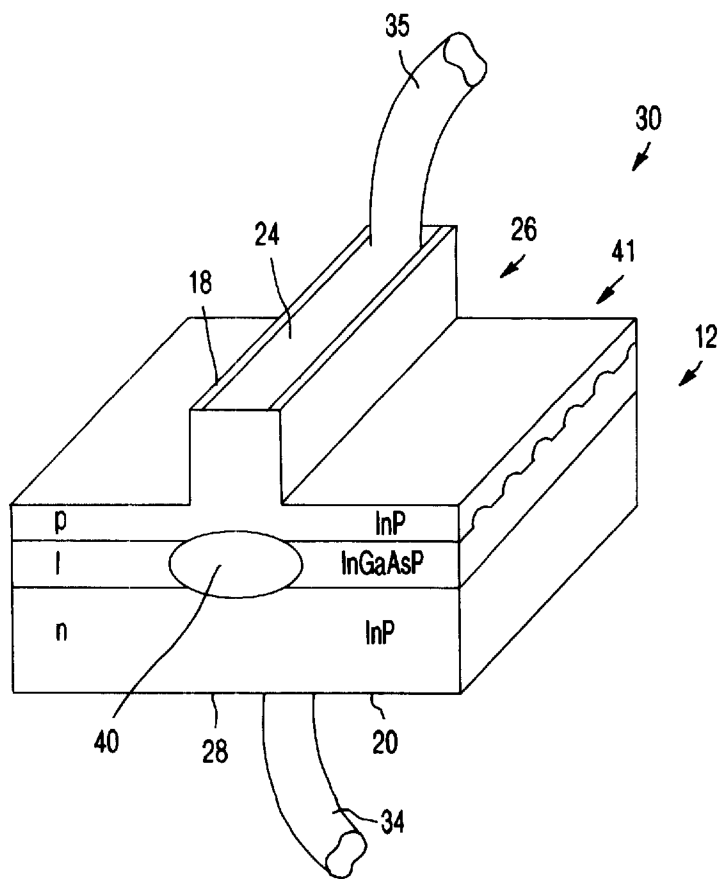
FIG. 2 is a perspective view illustrating a cross-section of the Bragg grating device of FIG. 1.

Turning now to FIG. 2, the individual portion 30 of the Bragg grating device 10 of FIG. 1 is illustrated in greater detail. The portion 30 is preferably part of a simple double heterostructure InP/InGaAsP waveguide 12. The defraction grating 26 is written on top of a core region 40 of the guide 12. The thickness of the core region 40 is preferably several microns while its width is about two to four microns and upper and lower cladding thicknesses are about 1 micron. The upper electrode 24 and lower electrode 28 are preferably placed opposite each other on the top and bottom surfaces 18 and 20 of the guide 12 using a conducting substrate. The electrical lead 34 is coupled to the lower electrode 28 and the electrical load 35 is coupled to the upper electrode 24. As described above, the electrical lead 34 selectively delivers varying amounts of current across the Bragg grating structure 26 via the electrodes 24 and 28 such that the index of refraction and thus the Bragg wavelength at the core 40 is changed. For large current densities, an anti-reflective coating 41 may be used to prevent lasing.

Figure 3:
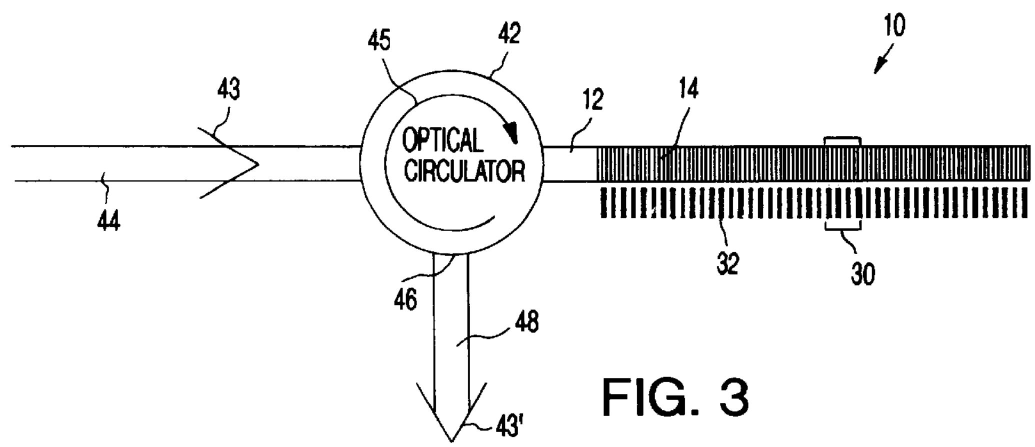
FIG. 3 is a schematic view illustrating the Bragg grating device of the present invention in conjunction with an optical circulator for use as a variable weight tap.
Figure 4:
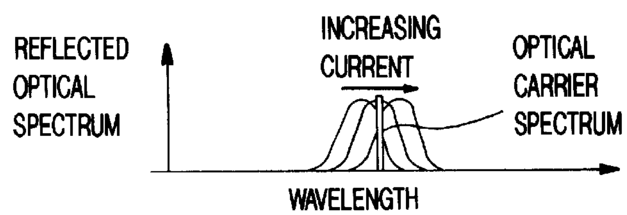
FIG. 4 is a graph illustrating the relationship of tap weight to injected current in the Bragg grating device of FIG. 3.

Referring now to FIGS. 3 and 4, the Bragg grating device 10 of the present invention is shown in conjunction with an optical circulator 42 for use as a variable weight tap. Such a variable weight tap may find particular usefulness in RF signal processors and arbitrary waveform generators. In FIG. 3, an optically modulated signal 43 enters into waveguide 44 from the left and enters the optical circulator 42. The signal travels clockwise from port to adjacent port as indicated on the optical circulator 42 (shown by the direction of the arrow 45) and enters into the waveguide 12 containing the Bragg grating device 10.

If none of the Bragg grating portions, such as portion 30, is activated (i.e., injected with current), the signal 43 continues along the waveguide 12 to the right. However, by injecting current into a portion of the grating structure 14, such as the portion 30, part of the optical signal 43 matching the refractive index of the activated portion 30 is reflected off of the activated portion 30 and travels back through the waveguide 12 to the optical circulator 42. After re-entering the optical circulator 42, the reflected signal 43' continues clockwise to the exit port 46 and travels along the waveguide 48.

According to this structure, the time delay experienced by the reflected signal 43' may be controlled by appropriately selecting the portion of the Bragg grating structure 14 that is injected with current. Further, the tap weight (i.e., the amount of light that is reflected by the activated portion) may be controlled by adjusting the amount of current that is injected into the selected portion of the grating structure 14. That is, as illustrated in FIG. 4, because the optical frequency of the input signal 43 is constant, the tap weight is varied as the injected current increases the refractive index of the selected grating portion. Thus, changing the level of injected current moves the reflectivity spectrum of the activated portion in or out of the pass band. As the current increases, the wavelength of the reflected optical spectrum changes. This increase shifts the reflectivity spectrum to longer wavelengths. Accordingly, the optical carrier 12, which has a fixed optical wavelength, resonates or reflects from matched wavelengths different portions of the grating reflectivity spectrum and the amount of optical power that is reflected changes accordingly.

Figure 5:
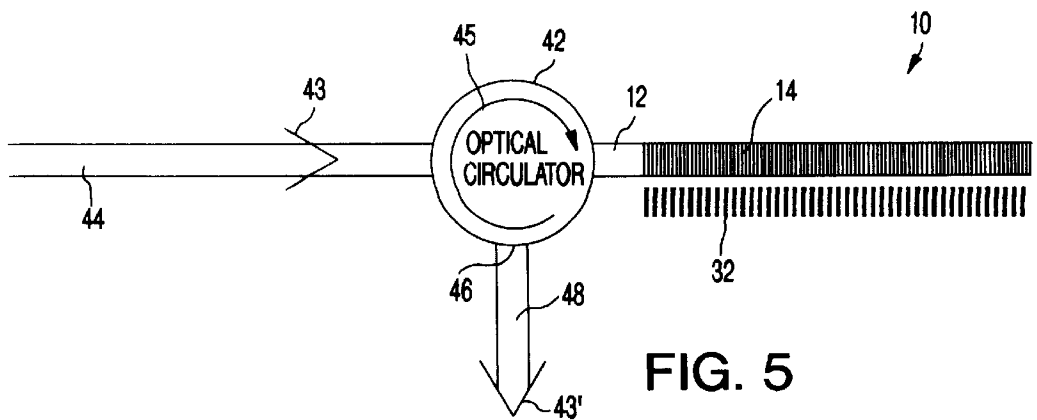
FIG. 5 is a schematic view illustrating the Bragg grating device of the present invention in conjunction with an optical circulator for use as a high precision true time delay.

Turning now to FIG. 5, the device of FIG. 3 is reillustrated such that its use for generating a high precision true time delay may be described. By injecting current into individual electrodes along the Bragg grating device 10, an addressable, discrete, true time delay is effected on time scales impracticable through prior technology. By injecting current into combinations of portions of the Bragg grating structure 14, a continuously variable true time delay is effected. In addition, different portions of the Bragg grating structure 14 can be shifted to different center wavelengths by injecting different current levels into each portion. This can provide the function of wavelength division multiplexed (WDM) true time delay. True time delay in a WDM system is then provided when multiple wavelengths are input into the Bragg grating device 10 with different wavelengths getting different time delays.

To effectuate the foregoing, the optically modulated signal 43 is input through the waveguide 44 and delivered to the optical circulator 42. The laser source for the optically modulated signal 43 preferably has a fixed frequency. After traveling routing from port to clockwise adjacent port in the optical circulator 42, the optical signal 43 travels through the waveguide 12 until the Bragg condition is met. The Bragg condition is satisfied when the optical wavelength, $\lambda_{BRAGG}=2N\Lambda$. Here, $\Lambda$ is the physical grating spacing and N is the index of refraction which varies with the amount of current injected through the electrodes along the Bragg grating device 10. In this way, 1% changes in N can be imposed ($\Delta\lambda$=15 nm@$\lambda$=1500 nm).

At the point when $\lambda_{BRAGG}=2N\Lambda$, the optical signal 43 is reflected and the round trip travel time is the desired true time delay. The reflected optical signal 43' re-enters the optical circulator 42 and exits the port 46 to travel along the waveguide 48. The time delay is in discreet steps defined by the positions of the electrodes along the length of the waveguide 12. If no discreet time step sizes are desired, then a combination of adjacent electrodes may be injected with current to effect a continuously variable time delay. This technique may find particular usefulness in creating the necessary time delay for a phased array antenna. Advantageously, by making the Bragg grating device 10 holographically, a Bragg grating structure 14 on the order of 10 cm may be manufactured. Longer lengths are also possible by connecting 10 cm sections together with optical waveguides.

Turning now to FIGS. 6–9, the Bragg grating device 10 of the present invention is illustrated in conjunction with the optical circulator 42 for use in optical filter shaping. With the device 10, any desired optical filter shape for use in either reflection or transmission applications can be made by specifically configuring the current injected portions of the Bragg grating structure 14. For example, by injecting two separate portions of the Bragg grating device 10, such as portions 30A and 30B, with two different levels of injection current, the two portions 30A and 30B are provided with two different effective indices of refraction, $N_1$ and $N_2$. Similarly, by appropriately injecting current into various portions of the Bragg grating device 10 to a measured degree, the optical filter may be shaped to any desired filter function. A sin X/X function or other filter window function can provide filter shaping to reduce side lobes or optimize other filter characteristics.

Figure 7:
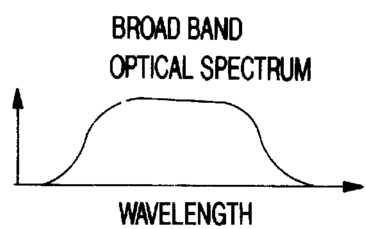
FIG. 7 is a graphical illustration of the optical spectrum of the light entering the Bragg grating device of FIG. 6.
Figure 8:
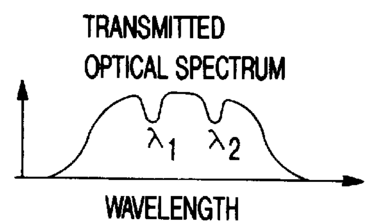
FIG. 8 is a graphical illustration of the optical spectrum of the light transmitted by the Bragg grating device of FIG. 6.
Figure 6:
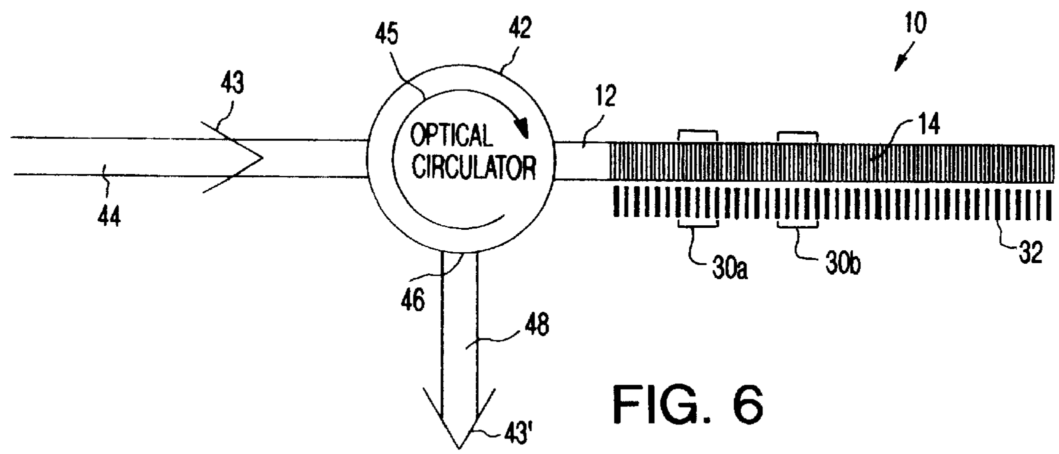
FIG. 6 is a schematic view illustrating the Bragg grating device of the present invention in conjunction with an optical circulator for use in optical filter shaping.
Figure 9:
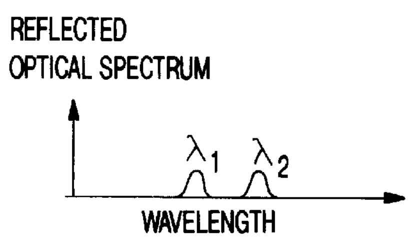
FIG. 9 is a graphical illustration of the optical spectrum of the light reflected by the Bragg grating device of FIG. 6.

In FIG. 6, the optically modulated signal 43 entering into the waveguide 44 has a broad band optical spectrum such as that illustrated in FIG. 7. After passing through the optical circular 42 the optical signal 43 continues through the Bragg grating device 10. The optical spectrum of the signal transmitted through the Bragg grating device 10 (i.e., continuing to the right in FIG. 6 and not returning to the optical circular 42) has an optical spectrum such as that illustrated in FIG. 8. The reflected signal 48 from the Bragg grating device 10 returns to the optical circular 42 and is ejected through the port 46 to the waveguide 48 with an optical spectrum such as that illustrated in FIG. 9.

If desired, the Bragg grating device 10 can be provided with a chirp for the purpose of compensating for distortion of a modulated optical signal due to dispersion in an optical fiber used in long haul communications networks. This is accomplished by injecting slightly greater levels of current into consecutive portions of the Bragg grating structure 14 along the length of the Bragg grating device 10. The advantage here, when compared to traditional, static, dispersion compensators, is that the Bragg grating device 10 can be modified to compensate for different long haul distances which have different amounts of distortion. It could further be optimally adjusted for a particular dispersion unique to a particular fiber type.

Referring now again generally to FIG. 5, the present invention may also be used as an optical spectrum analyzer to obtain the optical spectrum of an unknown signal by configuring the Bragg grating device 10 with a linear chirp. To accomplish this, the injected current is varied linearly with distance along the Bragg grating structure 14. The input optical signal 43 is then gated on and off. The off time equals the round trip time delay to the end of the grating structure 14. The spectral components are output from the optical circulator 42 with short wavelengths exiting first and long wavelengths exiting last. Therefore, the time axis of the output spectral components corresponds to optical wavelength. Preferably, the gradient of the chirp is tailored to the optical bandwidth of the input spectrum. One could then integrate a small or a large range of optical spectra.

The present invention may also be used for complex taps by displacing the grating Bragg structure 14 in time and distance. Still referring to FIG. 5, a complex processor is constructed using the present invention by injecting current into a portion of the Bragg grating structure 14 which is located at a position that satisfies the amplitude adjustment of the reflected or transmitted waveform but also adjusts the waveform to the desired phase as measured against a reference phase or reference position in delay distance. As described above, the Bragg grating structure 14 is adjusted to its operative spacing by adjustment of the injected current. This may be accomplished over a distance of several adjacent electrodes if desired. For example, a first set of electrodes along the device 10 may be injected with current to adjust the reflection coefficient to a known value. Thereafter, a second set of electrodes of the same size as the first set but located downstream thereof could be injected with the same amount of current to obtain the same result in the amplitude component while shifting the phase of the reflected signal 43' relative to a time reference. In this way, a complex phasor may be implemented in the Bragg grating structure 14 which and may be combined with other structures to form complex signal processing on complex signals.

The present invention may also be used to perform optical switching in the form of both signal routing and Time Division Multiple Access (TDMA) frame formatting. Referring still to FIG. 5, signal routing is implemented by controlling the travel direction of the optically modulated signal 43. If the Bragg grating structure 14 is made to be reflective then the reflected signal 43' is routed out through the time delayed output. Otherwise, the signal 43 passes through the Bragg grating structure 14 as a transmission. In this way, the non-switched signal 43 passes without being effected but the reflected signal 43' can be phased as described previously to fit within the timing requirements of a frame format as is found with TDMA communications standards. Additionally, all of these processes are effected while modifying the amplitude of the signal distribution. In other words, it is possible to send 25% of the signal power in one direction and the complimentary 75% in the other direction. The numerical relationship is, in general, that fractional power (A) can be routed straight through and (1-A) power can be phase adjusted and routed out the reflective port 46 of the circulator 42. This achieves not only routing of signals but the power allocation associated with their distribution as well.

Thus, the present invention provides an addressable, adaptable, semiconductive Bragg grating device. The Bragg grating device enables a plurality of portions of a Bragg grating structure to be selectively injected with current such that the refractive index of each portion of the Bragg grating structure may be optimally controlled. In accordance with the teachings of the present invention, the entire Bragg grating structure may be injected with current, none of the Bragg grating structure may be injected with current, an individual portion of the Bragg grating structure may be injected with current, or select combinations of individual portions of the Bragg grating structure may be injected with current. Further, the amount of current injected into all, none, individual, or select combinations of the portions of the Bragg grating structure may be varied to effectuate further control of the reflected and transmitted optical signal. Although the device of the present invention will find usefulness in many different environments, it is presently believed to be particularly well suited for use in optical and RF spectrum analyzers, true time delays for phased array antennas and optical switches.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. An optical device comprising:

an optical waveguide;

a grating structure formed in said optical waveguide;

a first plurality of electrodes disposed on said optical waveguide;

a second plurality of electrodes electrically isolated from one another and disposed on said optical waveguide, said second plurality of electrodes being discretely electrically coupled to individual elecrodes of said first plurality of electrodes through said grating structure; and a plurality of electrical leads coupled between said second plurality of electrodes and a power source.

2. The device of claim 1 wherein said optical waveguide further comprises a semiconductive substrate.

3. The device of claim 1 wherein said first and second plurality of electrodes further comprise individual electrodes disposed in an axially spaced relation along a length of said optical waveguide.

4. The device of claim 1 wherein said first plurality of electrodes further comprise individual electrodes electrically isolated from one another.

5. The device of claim 1 wherein said plurality of electrical leads are selectively injectable with current such that selected portions of said grating structure may be variably activated via said first and second plurality of electrodes.

6. A Bragg grating device comprising:

a semiconductive optical wave guide;

a Bragg grating structure formed along a length of said optical wave guide;

a first plurality of electrodes disposed on a first surface of said optical waveguide and communicating with select members at said Bragg grating structure;

a second plurality of electrodes disposed on a second surface of said optical waveguide and communicating with said select members of said Bragg grating structure such that individual electrodes of said second plurality of electrodes are electrically coupled to individual electrodes of said first plurality of electrodes via said select members of said Bragg grating structure; and a plurality of electrical leads electrically coupled between said second plurality of electrodes and a power source such that a refractive index of discrete portions of said Bragg grating structure may be selectively varied.

7. The Bragg grating device of claim 6 further comprising a controller disposed between said plurality of electrical leads and said power source for varying a magnitude and distribution of power among said discrete portions of said Bragg grating structure.

8. The Bragg grating device of claim 6 wherein said semiconductive optical waveguide further comprises a double heterostructure InP/InGaAsP waveguide having said Bragg grating structure written over a core region thereof.

9. The Bragg grating device of claim 6 further comprising an antireflective coating disposed on said semiconductive optical waveguide.

10. An addressable, adaptable, semiconductive, Bragg grating device comprising:

a semiconductive optical waveguide having a preselected length;

a Bragg grating structure etched into said waveguide along said length;

a first plurality of electrodes disposed on a first surface of said waveguide and being equidistantly spaced apart along said length so as to be electrically isolated from one another, individual electrodes of said first plurality of electrodes being discretely coupled to separate members of said Bragg grating structure;

a second plurality of electrodes disposed on a second surface of said waveguide opposite said first plurality of electrodes, said second plurality of electrodes being equidistantly spaced apart along said length so as to be electrically isolated from one another, individual electrodes of said second plurality of electrodes being discretely coupled to said separate members of said Bragg grating structure so as to communicate with said individual electrodes of said first plurality of electrodes to thereby define a plurality of discrete Bragg grating portions of said Bragg grating structure;

a plurality of electrical leads electrically coupled to said second plurality of electrodes; and a controller coupled between said plurality of electrical leads and a power source to vary a magnitude and distribution of current among said plurality of discrete Bragg grating portions.

11. The Bragg grating device of claim 10 wherein said semiconductive optical waveguide further comprises a double heterostructure InP/InGaAsP waveguide having said Bragg grating structure written over a core region thereof.

12. The Bragg grating device of claim 10 further comprising an antireflective coating disposed on said semiconductive optical waveguide.

* * * * *